(12) United States Patent
Ordentlich et al.

(10) Patent No.: US 10,102,205 B2
(45) Date of Patent: Oct. 16, 2018

(54) STORING RUN-LENGTH LIMITED TWO-DIMENSIONAL ENCODED BIT PATTERNS IN MEMORY ARRAYS

(71) Applicant: Hewlett Packard Enterprise Development LP, Houston, TX (US)

(72) Inventors: Erik Ordentlich, San Jose, CA (US); Ron M. Roth, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 88 days.

(21) Appl. No.: 15/111,703

(22) PCT Filed: Jan. 30, 2014

(86) PCT No.: PCT/US2014/013764
§ 371 (c)(1),
(2) Date: Jul. 14, 2016

(87) PCT Pub. No.: WO2015/116084
PCT Pub. Date: Aug. 6, 2015

(65) Prior Publication Data
US 2016/0329097 A1 Nov. 10, 2016

(51) Int. Cl.
*G06F 17/30* (2006.01)
*G11C 13/00* (2006.01)
*G06F 3/06* (2006.01)

(52) U.S. Cl.
CPC ............ *G06F 17/30* (2013.01); *G06F 3/0604* (2013.01); *G06F 3/0638* (2013.01);
(Continued)

(58) Field of Classification Search
CPC ............ G11C 13/004; G11C 13/0007; G11C 13/0069; G06F 3/0679; G06F 3/0638; G06F 3/0604
See application file for complete search history.

(56) References Cited

U.S. PATENT DOCUMENTS

| | | | | |
|---|---|---|---|---|
| 5,535,187 A | * | 7/1996 | Melas ................. | G06T 9/005 360/40 |
| 5,635,933 A | * | 6/1997 | Fitzpatrick ......... | G11B 20/1426 341/58 |

(Continued)

OTHER PUBLICATIONS

International Searching Authority, The International Search Report and the Written Opinion, dated Feb. 16, 2015, 12 Pgs.

(Continued)

*Primary Examiner* — Ajay Ojha
(74) *Attorney, Agent, or Firm* — Trop, Pruner & Hu, P.C.

(57) ABSTRACT

In one implementation, a data storage system includes a memory array having memory devices in a crossbar configuration, and a memory controller for controlling data storage in the memory array. The memory controller includes an encoder to generate a 2-dimensional encoded bit pattern that encodes an input data. Each run-length of 0's and each run-length of 1's in each row or each column of the encoded bit pattern are at least of a predefined lower limit. The predefined lower limit is at least two. The memory controller includes a write controller to write the encoded bit pattern into the memory devices of the memory array, such that a number of consecutive memory devices in each row or each column of the memory array having a same state is based on the encoded bit pattern.

21 Claims, 8 Drawing Sheets

(52) U.S. Cl.
CPC .......... *G06F 3/0679* (2013.01); *G11C 13/004* (2013.01); *G11C 13/0007* (2013.01); *G11C 13/0069* (2013.01)

(56) References Cited

U.S. PATENT DOCUMENTS

| | | | |
|---|---|---|---|
| 5,933,103 A * | 8/1999 | Kim | G11B 20/1426 341/59 |
| 7,242,624 B2 | 7/2007 | Kolla et al. | |
| 7,778,061 B2 | 8/2010 | Robinett et al. | |
| 8,467,253 B2 | 6/2013 | Perner | |
| 2002/0196659 A1 | 12/2002 | Hurst et al. | |
| 2006/0002178 A1 | 1/2006 | Womack | |
| 2008/0172385 A1 | 7/2008 | Muttet | |
| 2012/0008374 A1 | 1/2012 | Huang et al. | |
| 2012/0089877 A1 | 4/2012 | Takeuchi et al. | |
| 2013/0210211 A1 | 8/2013 | Vereen et al. | |
| 2014/0215121 A1 | 7/2014 | Ordentlich | |
| 2015/0248332 A1 | 9/2015 | Ordentlich | |
| 2015/0352359 A1 | 12/2015 | Fredelake et al. | |
| 2016/0350000 A1 | 12/2016 | Ordentlich | |
| 2016/0352358 A1 | 12/2016 | Ordentlich | |

OTHER PUBLICATIONS

Zangeneh, M. et al., Design and Optimization of Nonvolatile Multibit 1T1R Resistive RAM, Sep. 10, 2013, 14 Pgs.

\* cited by examiner

STORING RUN-LENGTH LIMITED TWO-DIMENSIONAL ENCODED BIT PATTERNS IN MEMORY ARRAYS

BACKGROUND

Recent advancements in non-volatile memories have led to development of memristor-based memory devices that offer high storage capacity and high read-write speeds. A memristor, or a memristive device, is a resistive switching device that can be programmed to be in a low resistive state or a high resistive state. The low resistive state and the high resistive state of a memristor can be representative of digital data storage in binary form, with the low resistive state indicating a "1" storage and the high resistive state indicating a "0" storage. The resistive state of a memristor can also be changed from a low to a high, and vice versa, to switch between the "0" storage and the "1" storage in the memristor.

A memristor-based memory array is formed by multiple nanoscale memristors arranged in a crossbar configuration. Such a memory array is highly scalable and provides a high storage capacity that can be utilized in non-volatile memory applications.

BRIEF DESCRIPTION OF DRAWINGS

The detailed description is provided with reference to the accompanying figures. In the figures, the left-most digit(s) of a reference number identifies the figure in which the reference number first appears. The same numbers are used throughout the drawings to reference like features and components.

DETAILED DESCRIPTION

Figure 1:
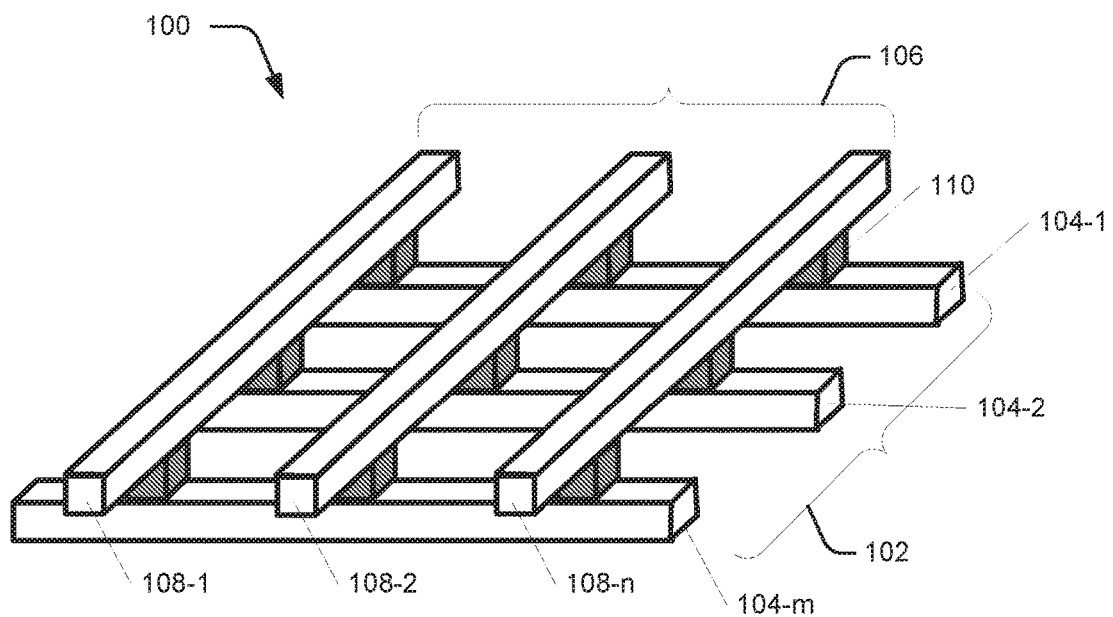
FIG. 1 illustrates a memristor-based memory array in a crossbar configuration, according to an example of the present subject matter.

The present subject matter relates to methods and systems for storing digital data into a memory array having memory devices in a crossbar configuration. The memory devices may be memristive devices, also referred to as memristors. In a crossbar configuration, the memory array has a first set of substantially parallel nanowires on top, and a second set of substantially parallel nanowires, aligned at about 90° to the first set, at bottom. A memristor is disposed at each point of intersection of the top and the bottom nanowires to form a row-column arrangement of memristors. The memristors in the memory array can be programmed to store digital data in binary form, i.e., in the form of 0's and 1's. The resistive state of one memristor is indicative of a state of one bit of the binary data. By applying a characteristic store-voltage across a memristor for storing 1 or 0, the memristor can be set to a low resistive state to store a "1" or can be set to a high resistive state to store a "0".

For retrieving the binary data stored in a memory array, each memristor is read to determine its resistive state. For this, each memristor is selected uniquely by selecting the corresponding row and column of the crossbar and a read-voltage is applied across the selected memristor to determine the resistance of the selected memristor. The applied read-voltage is lower than the applied store-voltage to ensure that the resistance of the memristor is not varied by the read-voltage.

To read a sequence of memristors of a memory array, a train of read pulses is provided to the memory array. The number of read pulses in the train is equal to the number of memristors that are to be read. Each read pulse constitutes a cycle of voltage signal having a first part with an amplitude substantially equal to the read voltage and a second part with an amplitude substantially equal to zero voltage. The cycle of voltage signal in a read pulse is referred to as the read pulse cycle. The memristors in the sequence are read serially, with one memristor being read over one read pulse cycle. A response signal is obtained from the respective memristor over the read pulse cycle. The response signal is a characteristic of 0 or 1 stored at that memristor.

The read pulse cycle has a lower limit for its width, so that the 0 and the 1 stored in a memristor can be differentiated correctly. The lower limit for the width of the read pulse cycle is limited by the minimum integration time over which the response signal is to be integrated in order to read the memristor correctly. The minimum integration time is restricted by the resistor-capacitor (RC) time constant of a read circuit formed with a memristor. If the width of the read pulse cycle is below the lower limit, bit interference may occur and consecutive memristors, particularly when they store 0-1-0 or 1-0-1, may not be read correctly.

Further, the speed of reading of a sequence of memristors in a memory array depends on the width of the read pulse cycle. The lower the width, the higher is the speed of reading. As there is a limit on how short the width of the read pulse cycle can be due the constraint of minimum integration time, the maximum speed of reading of sequence of memristors in the memory array is limited.

Methods and systems for storing digital data into a memory array having memory devices, such as memristors, in a crossbar configuration are described herein. With the methods and the systems of the present subject matter, the speed of reading of memory devices in the memory array to retrieve the data stored therein can be increased. The speed can be increased at least by a factor of two.

In accordance with the present subject matter, data for storing in the memory array may be received and encoded into a 2-dimensional (2D) encoded bit pattern having combinations of 0's and 1's in rows and columns. The data to be stored is referred to as the input data for the memory array. The 2D encoded bit pattern is hereinafter referred to as the encoded bit pattern. The input data is encoded such that each run-length of 0's and each run-length of 1's in each of the rows or in each of the columns of the encoded bit pattern are at least of a predefined lower limit, where the predefined lower limit is at least two. The run-length of 0's refers to the number of consecutive 0's in a row or a column of the encoded bit pattern, and the run-length of 1's refers to the number of consecutive 1's in a row or a column of the encoded bit pattern. For example, a row having '0011100011' has a run-length of 0's of two, followed by a run-length of 1's of three, followed by a run-length of 0's of three, followed by a run-length of 1's of two. The encoded bit pattern is then stored into the memory devices of the memory array, such that a number of consecutive memory devices in each row or in each column of the memory array that have the same state is based on the encoded bit pattern. With this, the number of consecutive memory devices in each row or in each column having the same state is at least two.

In an example implementation, the input data is encoded such that each run-length of 0's and each run-length of 1's in each row or in each column of the 2D encoded bit pattern are at most of a predefined upper limit. In an example, the predefined upper limit can be 8.

The data stored in the memory array is retrieved from the memory array by reading the memory devices. The memory devices are read depending on the encoding of the input data and the storing of the encoded data in the memory array. In an example implementation, when the input data is encoded such that the run-lengths of 0's and the run-lengths of 1's in each row of the encoded bit pattern are at least of the predefined lower limit, the memory devices in the memory array are read row-wise. In another example implementation, when the run-lengths of 0's and the run-lengths of 1's in each column of the encoded bit pattern are at least of the predefined lower limit, the memory devices in the memory array are read column-wise. Thus, according to the present subject matter, the memory devices in the memory array are read row-wise or column-wise depending on whether the number of consecutive memory devices in each row of the memory array having the same state is at least two or the number of consecutive memory devices in each column of the memory array having the same state is at least two.

With the encoding of the input data and the storing of the encoded data in accordance with the present subject matter, each memory device in a row or a column, depending on the case, can be read over a substantially shorter read pulse cycle than the one used otherwise. As mentioned earlier, the minimum width of the read pulse cycle is limited by the integration time of the response signal for correctly reading a memory device. If the input data is encoded such that the run-lengths of 0's and the run-lengths of 1's in each row is at least d, where d≥2, then at least d number of consecutive memory devices in a row have the same state. With this, the integration time for reading each of the consecutive devices having the same state in a row can be reduced by a factor of 1/d. Such reduction in the integration time enables the reduction of the lower limit for the width of the read pulse cycle by a factor of 1/d. That is, each memory device can be read correctly over a read pulse cycle of a width shorter by a factor of 1/d. In effect the width of the read pulse cycle can be less than the RC time constant of the read circuit formed by the memory device.

The reduction of the width of read pulse cycle by a factor of 1/d reduces the time taken to read the memory array. This amounts to increase in the speed of reading of memory devices in the memory array by a factor of d. The larger the value of d the higher is the increase the speed of reading.

The methods and systems of the present subject matter are further described with reference to FIGS. 1 to 7. It should be noted that the description and figures merely illustrate the principles of the present subject matter. It is thus understood that various arrangements can be devised that, although not explicitly described or shown herein, embody the principles of the present subject matter. Moreover, all statements herein reciting principles, aspects, and embodiments of the present subject matter, as well as specific examples thereof, are intended to encompass equivalents thereof.

FIG. 1 illustrates a memristor-based memory array 100 in a crossbar configuration, according to an example of the present subject matter. For the sake of simplicity, the memristor-based memory array 100 may interchangeably be referred to as the memory array 100. The memory array 100, as shown, is an m×n memory array formed by two sets of substantially parallel nanowires in the crossbar configuration. A first set 102 of m number of substantially parallel nanowires 104-1, 104-2, . . . , 104-m are positioned at about 90° to a second set 106 of n number of substantially parallel nanowires 108-1, 108-2, . . . , 108-n. The region at the intersection between each of the nanowires 104-1, 104-2, . . . , 104-m of the first set 102 and each of the nanowires 108-1, 108-2, . . . , 108-n of the second set 106 is disposed with a memristor 110 to form a 2-dimensional (2D) matrix of memristors. The 2D matrix of memristors arranged in m rows and n columns provide m×n distinct storage locations in the memory array 100. Each memristor 110 in the memory array 100 is between a distinct pair of nanowires, one from the first set 102 and the other from the second set 106. Thus, each memristor 110 can be uniquely addressed and selected based on the corresponding pair of nanowires from the first set 102 and the second set 106. It may be noted that the memory array 100 in FIG. 1 is an example illustration of m×n memristor-based memory array 100 for the purpose of description of the present subject matter and is by no means restricted to the illustrated example. Other configurations of the memory array with multiple memristors are also possible.

The description below describes the concept of reading of one memristor in the memory array 100 over a read pulse cycle. To read a memristor, the row containing the memristor is selected by a row selector and a read pulse from a read controller is steered to the selected row. Then, the column containing the memristor is selected by a column selector and a response signal corresponding to the memristor is obtained from the selected column.

Figure 2A:
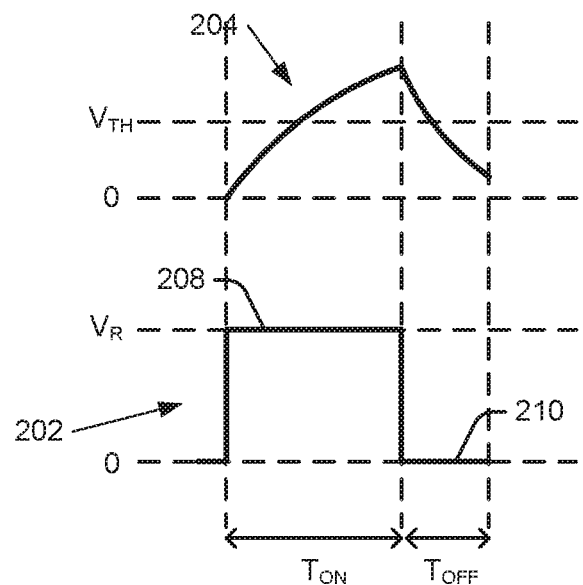
FIG. 2(a) illustrates a read pulse for reading one memristor of a memory array, and a response signal when 1 is stored in the memristor.
Figure 2B:
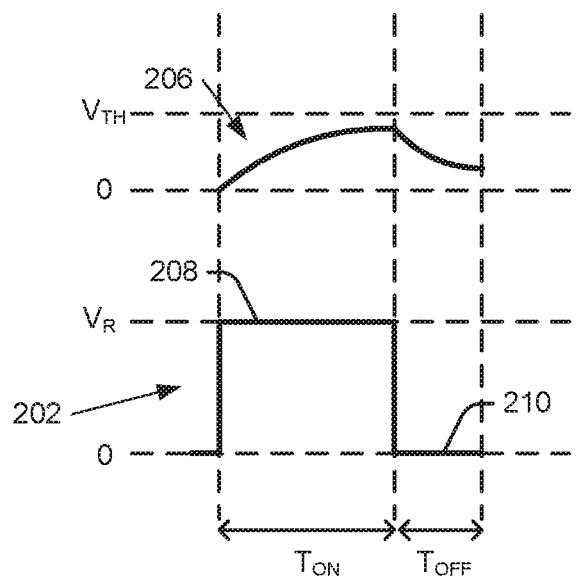
FIG. 2(b) illustrates a read pulse for reading one memristor of a memory array, and a response signal when 0 is stored in the memristor.

FIG. 2(a) illustrates a read pulse 202 for reading one memristor of a memory array, and a response signal 204 when 1 is stored in the memristor. FIG. 2(b) illustrates a read pulse 202 for reading one memristor of a memory array, and a response signal 206 when 0 is stored in the memristor. As shown, the cycle of the read pulse 202 includes an ON part 208 of a width $T_{ON}$ and an OFF part 210 of a width $T_{OFF}$. The ON part 208 has an amplitude substantially equal to the read voltage $V_R$ for reading a memristor, and the OFF part 210 has an amplitude substantially equal to zero. The response signal 204, 206 is a response voltage signal integrated over the read pulse cycle applied to the memristor. As shown, the response signal 204, 206 observes a damped rise and fall in the signal at low-to-high and high-to-low transitions in the read pulse cycle. The damped rise and fall are due to the parasitic capacitance, and other such capacitance, in the read circuit formed with the memristor. The response signal 204, 206 is evaluated with respect to a threshold voltage $V_{TH}$ to determine whether 0 or 1 is stored in the memristor. The evaluation is made at the beginning of the OFF part 210. For a 1 stored in the memristor, the response signal at the beginning of the OFF part 210 is above the threshold voltage $V_{TH}$, as depicted by the response signal 204. For a 0 stored in the memristor, the response signal at the beginning of the OFF part 210 is below the threshold voltage $V_{TH}$, as depicted by the response signal 206.

Based on the illustration and the description herein, it can be noted that the width $T_{ON}$ of the read pulse 202 refers to the integration time for reading the memristor, and the width $T_{OFF}$ of the read pulse 202 refers to the reset time. The reset time is the time in which the capacitance in the read circuit is discharged sufficiently to take the response signal at least below the threshold voltage $V_{TH}$ and in which the next row/column can be selected by the row/column selector for the next memristor. Also, depending on the capacitance in the read circuit formed with the memristor, there exist a minimum integration time for reading for the response signal to exceed the threshold voltage $V_{TH}$, so that the memristor can be read correctly. The minimum integration time is limited by the RC time constant of the read circuit. Such limitation of the minimum integration time governs the lower limit of the width of the read pulse cycle, and particularly the lower limit of the width $T_{ON}$ of the read pulse 202.

Figure 3:
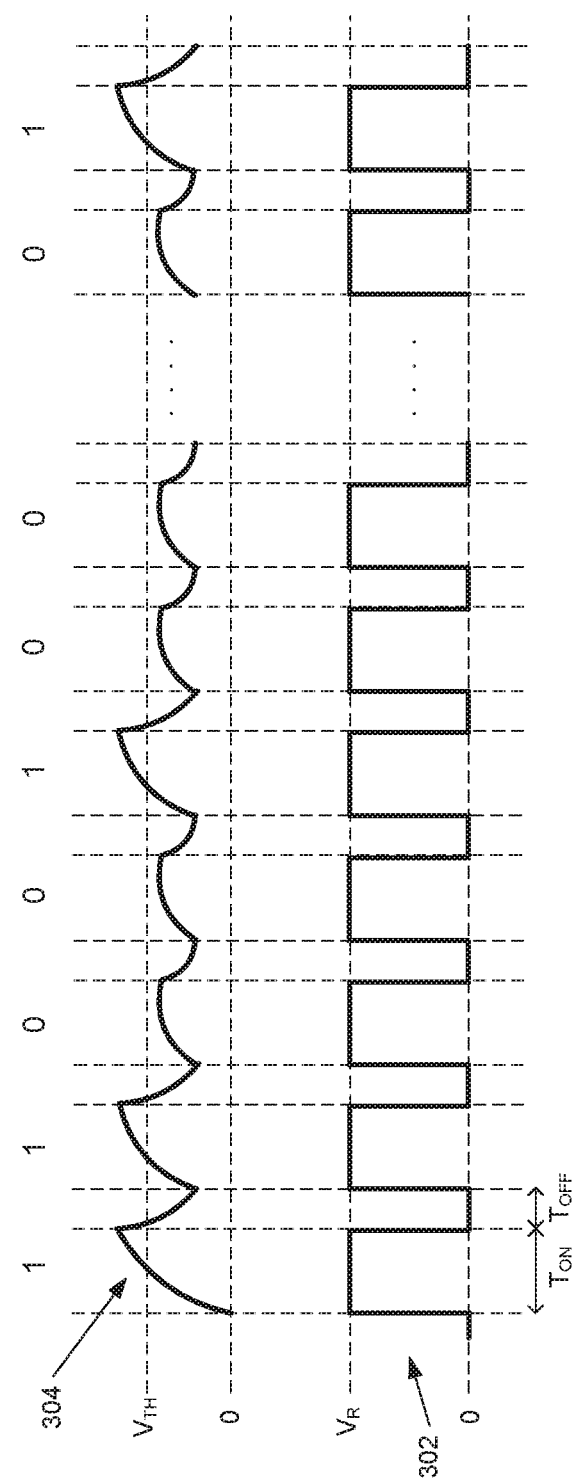
FIG. 3 illustrates a train of read pulses and a response signal for reading a sequence of memristors of a memory array.

Now, to read the memory array 100 the memristors in the memory array 100 may be read row-wise or column-wise. In the row-wise reading of the m×n memory array 100, memristors in one row are read one at a time using n number of read pulses, and the entire memory array 100 is read using m×n number of read pulses. FIG. 3 illustrates a train of read pulses 302 and a response signal 304 for reading memristors in the m×n memory array 100. The response signal 304 is an illustrative example for reading an m×n data sequence '1100101 . . . 01' stored row-wise in the m×n memory array 100. The example illustrated through FIG. 3 is a case where the input data is not encoded based on the encoding procedure of the present subject matter, i.e., when the run-length of 0's or the run-length of 1's in the encoded data can be 1. As described above, the width $T_{ON}$ of the read pulses has to be equal to or above a prescribed minimum for correctly reading the memristors individually and in a sequence. If the width $T_{ON}$ is below the prescribed minimum, the sequence of memristors storing 0-1-0, as illustrated in FIG. 3, cannot be read correctly. The prescribed minimum for the width $T_{ON}$ and consequently the width of the read pulse cycle limits the maximum speed at which the read pulses can be sent and the speed at which the memristors in the memory array 100 can be read correctly.

Figure 4A:
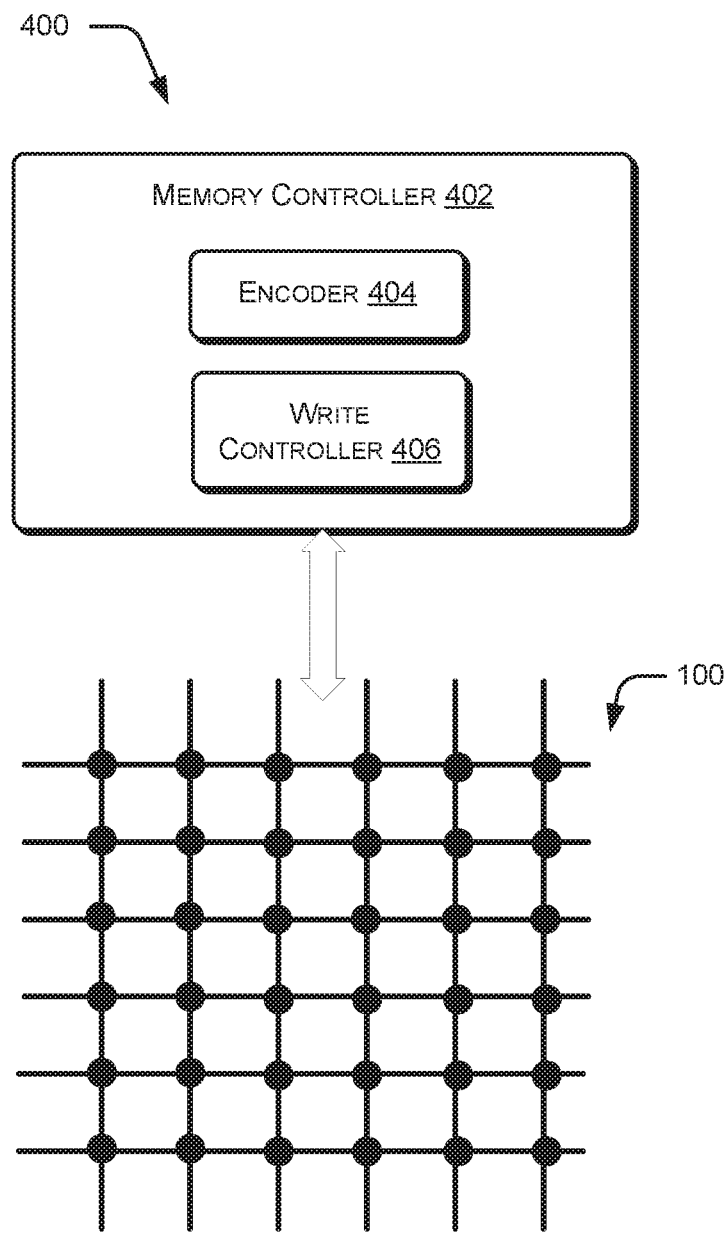
FIG. 4(a) illustrates a data storage system having the memristor-based memory array, according to an example of the present subject matter.

FIG. 4(a) illustrates a data storage system 400, according to an example of the present subject matter. The data storage system 400 includes the memristor-based memory array 100 having memristors in a crossbar configuration of m rows and n columns. The data storage system 400 is configured to store data into the memory array 100 in accordance with the present subject matter, such that a faster reading of the memory array 100 is enabled. The data storage system 400 includes a memory controller 402, coupled to the memory array 100, for controlling data storage in the memory array 100. The memory controller 402 includes an encoder 404 and a write controller 406. The encoder 404 is programmed to receive an input data and encode the input data for storing in the memory array 100. The write controller 406 is programmed to store or write the encoded data into the memory array 100. The procedure of encoding, followed by the encoder 404, is described in detail later in description.

Figure 4B:
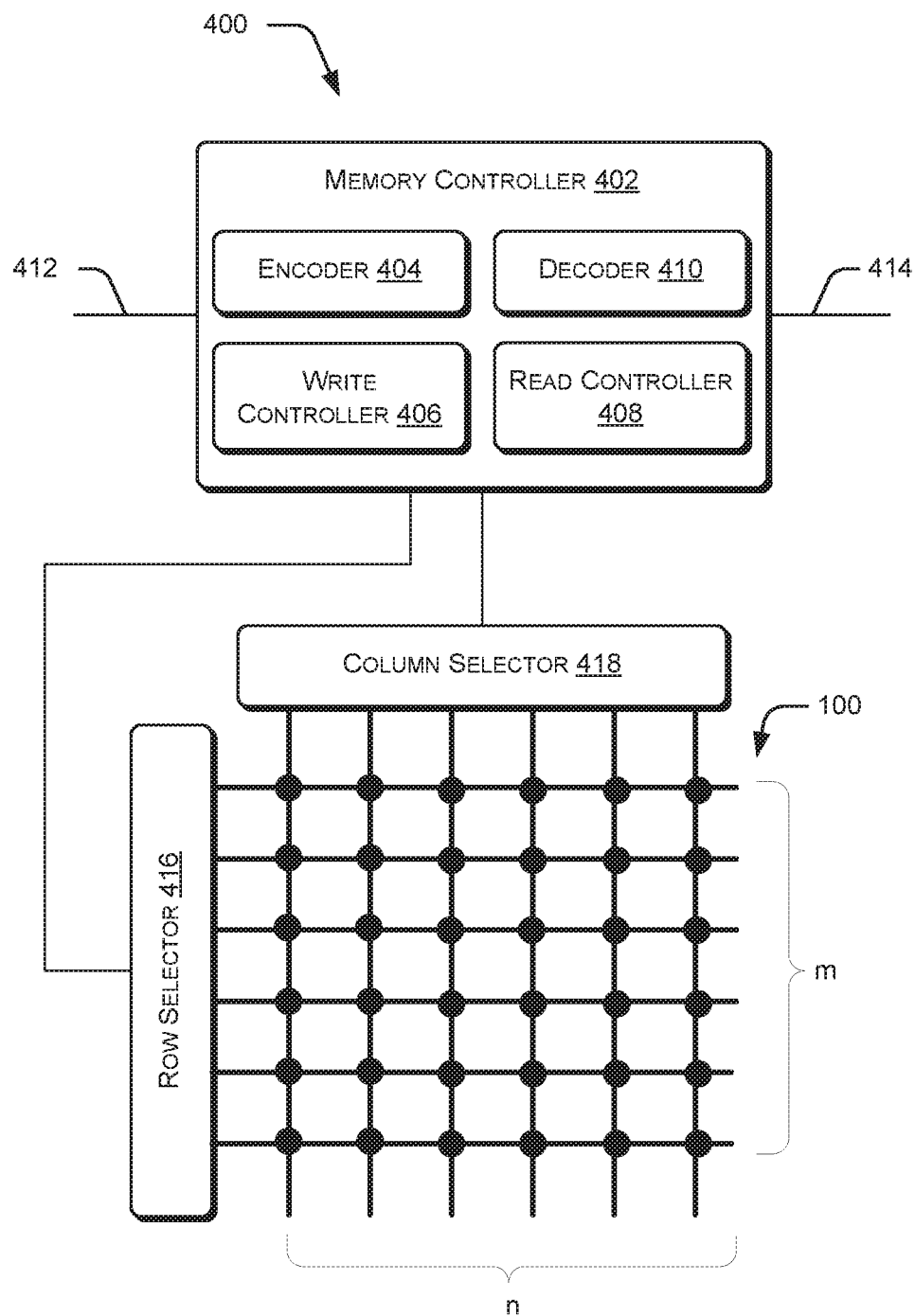
FIG. 4(b) illustrates the data storage system, according to an example of the present subject matter.

FIG. 4(b) illustrates the data storage system 400, according to an example of the present subject matter. As shown, apart from the encoder 404 and the write controller 406, the memory controller 402 includes a read controller 408 and a decoder 410. The read controller 408 is programmed to read the memristors in the memory array 100 for retrieving the encoded data from the memory array 100. The decoder 410 is programmed to decode the retrieved encoded data in order to obtain the input data in the original form. The encoder 404 may receive the input data from an input channel 412, and the decoder 410 may transmit the decoded input data to an output channel 414.

The memory controller 402 is communicatively coupled to the memory array 100 through a row selector 416 and a column selector 418. The row selector 416 and the column selector 418 select a row from m rows and a column from n columns, respectively, for the purpose of writing of data into the corresponding memristor in the memory array 100 as communicated by the write controller 406. The row selector 416 and the column selector 418 also select a row and a column, respectively, for the purpose of reading of data from the corresponding memristor in the memory array 100 as communicated by the read controller 408.

In an example implementation, the encoder 404 receives the input data and encodes the input data to generate a 2D encoded bit pattern. The encoded bit pattern includes binary encoded data such that each run-length of 0's and each run-length of 1's in each row or in each column of the encoded bit pattern are at least of a predefined lower limit, where the predefined lower limit is at least two. For the purposes of the description hereinafter, the predefined lower limit is also referred to as the run-length lower limit that describes the minimum run-lengths of 0's and 1's, and is denoted by 'd'. In an example, d can be ≥2, ≥3, ≥4, and so on. Also, the encoded bit pattern is denoted by 'E'.

The description below describes the generation of the encoded bit pattern E with the run-length lower limit d≥2, according to an example implementation. For the sake of simplicity, the generation of the encoded bit pattern E with the run-length lower limit d≥2 in each row of the encoded bit pattern E is described. The same procedure can be performed column-wise to generate the encoded bit pattern E with the run-length lower limit d≥2 in each column of the encoded bit pattern E. To generate the encoded bit pattern E, the encoder 404 at first converts the input data into a first binary array A with m rows and q columns. Considering that the input data is in binary form, the sequence of 0's and 1's in the input data are arranged row-wise to form the first binary array A.

After forming the first binary array A; the encoder 404 generates a second binary array B, from the first binary array A; with m rows and n columns. The second binary array B is such that each row of the second binary array B has a predefined number of 0's between two consecutive 1's. Let the predefined number of 0's be denoted by 'b'. The predefined number b is set based on the run-length lower limit d for the encoded bit pattern E. The predefined number b is one less than the run-length lower limit d. That is, for the run-length lower limit d=2, the predefined number b=1; for the run-length lower limit d=3; the predefined number b=2; and so on.

After generating the second binary array B, the encoder 404 generates the encoded bit pattern E by transforming the entries ($x_{i,1}$, $x_{i,2}$, . . . , $x_{i,n}$) of each of the m rows of the second binary array B into entries ($y_{i,1}$, $y_{i,2}$, . . . , $y_{i,n}$), such that the entry $y_{i,j}=y_{i,j-1}+x_{i,j}$ for j=1 to n, where $y_{i,0}=0$, and where the addition is modulo 2 addition. The encoded bit pattern E thus generated by the encoder 404 satisfies the run-length lower limit d≥2; i.e., the run-lengths of 0's and the run-lengths of 1's in each row of the encoded bit pattern E is at least d.

It is to be noted that in order to generate the encoded bit pattern E with the run-length lower limit d≥2 as described above, each row of the second binary array B should end with a predefined number of 0's. Let this predefined number of 0's be denoted by c. The predefined number c is based on the run-length lower limit d for the encoded bit pattern E. The predefined number c is one less than the run-length lower limit d. Thus, in an example implementation, the encoder 404 may generate from the first binary array A the second binary array B with m rows and n columns such that each row of the second binary array B has b number of 0's between two consecutive 1's, and has c number of 0's in the end. For this; c number of columns with 0's are added in the end, after the step to include b number of 0's between two consecutive 1's in each row.

Further, in an example implementation, the encoder 404 encodes the input data to generate the encoded bit pattern E such that the run-lengths of 0's and the run-length of 1's in each row or in each column are at most of a predefined upper limit. For the purposes of the description herein, the predefined upper limit is also referred to as the run-length upper limit that describes the maximum run-lengths of 0's and 1's, and is denoted by 'f'. In an example; f=8. Further, the maximum number of 0's between two consecutive 1's and the maximum number of 0's in the beginning of each row or each column of the first binary array A, as the case may be, depend on the run-length upper limit f. The maximum number of 0's between consecutive 1's is one less than the run-length upper limit f, and the maximum number of 0's in the beginning is equal to the run-length upper limit f.

Figure 5:
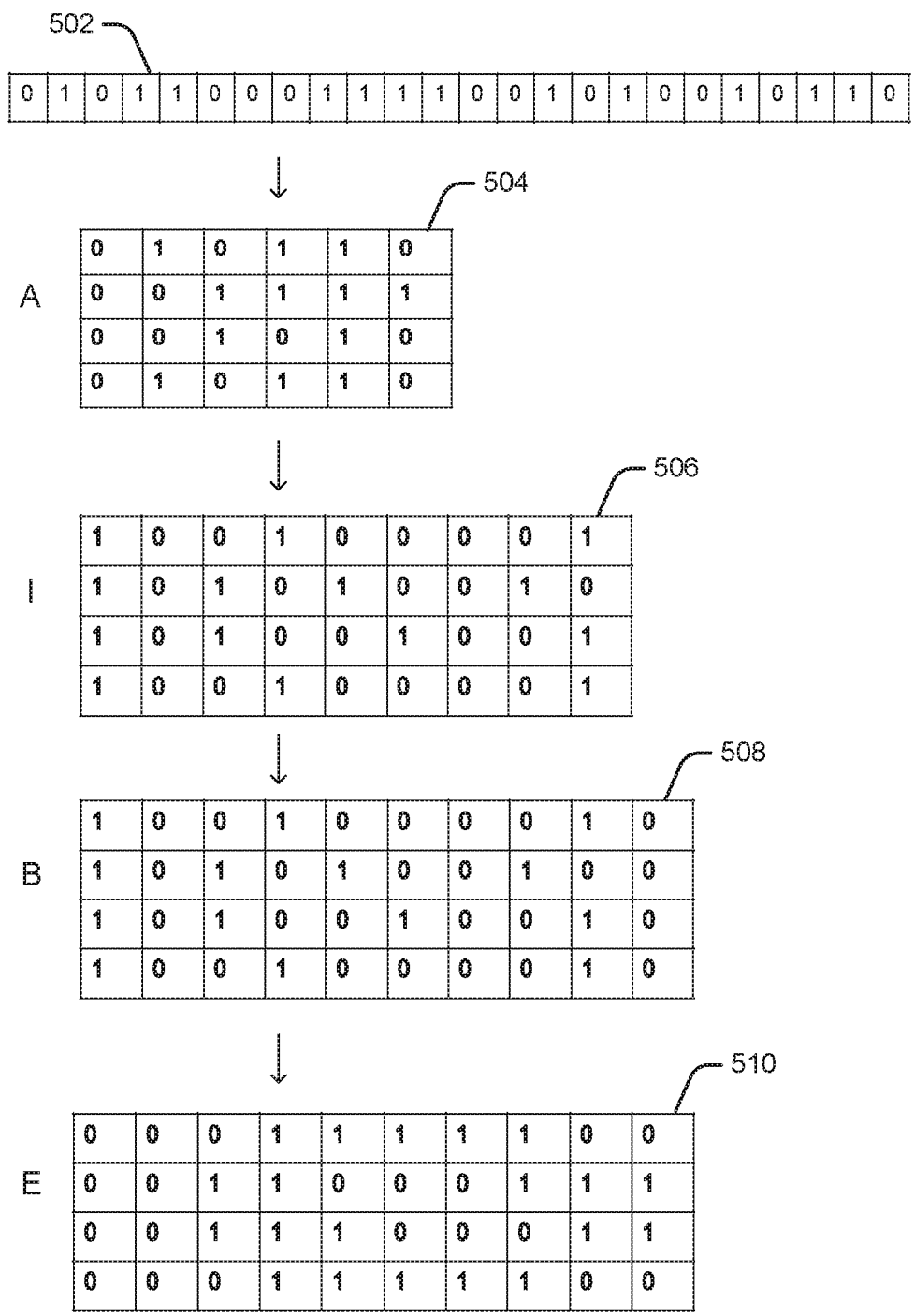
FIG. 5 illustrates encoding of an input data into a 2-dimensional encoded bit pattern, according to an example of the present subject matter.

FIG. 5 shows an illustrative example of encoding of an input data into a 2-dimension encoded bit pattern E as described above; according to the present subject matter. The example illustrated through FIG. 5 is for a case where the run-length lower limit d=2 and the run-length upper limit f=8 in the rows of the encoded bit pattern E. The example described herein is for the purpose of illustration; the input data can be encoded for other d's and other f's.

Referring to FIG. 5; an input data 502 of 24 bits is converted into a first binary array A, referenced by 504. The first binary array A is a rectangular array of 4 rows and 6 columns in the illustrative example; although the input data can be converted into any first binary array with even number of columns for the d=2 and f=8 case illustrated herein. Based on the first binary array A, an intermediate binary array I, referenced by 506, is generated, where each row of the intermediate array I has at least one 0 between two consecutive 1's and at most seven 0's between two consecutive 1's. In an example implementation, the intermediate binary array I is generated by performing (1,7) run-length limited (RLL) encoding on the entries in each row of the first binary array A. In (1,7) RLL encoding, two input entries, or bits, are encoded into three output entries, or bits, in accordance with Table 1 below. Such type of encoding is also referred to as 2/3 encoding having an encoding rate of 2/3. The intermediate binary array I of 4 of rows and 9 columns is generated by encoding the entries in each row of the first binary array A referring to Table 1.

TABLE 1

| Input entries or bits | Output entries or bits |
| --- | --- |
| 00 00 | 101 000 |
| 00 01 | 100 000 |
| 10 00 | 001 000 |
| 10 01 | 010 000 |

TABLE 1-continued

| Input entries or bits | Output entries or bits |
| --- | --- |
| 00 | 101 |
| 01 | 100 |
| 10 | 001 |
| 11 | 010 |

After this, a second binary array B, referenced by 508, is generated by adding one column of 0's in the end of the intermediate binary array I. Thus, the second binary array B is of 4 rows and 10 columns. After generating the second binary array B, the entries $(x_{i,1}, x_{i,2}, \ldots, x_{i,10})$ of each of the 4 rows of the second binary array B are transformed into entries $(y_{i,1}, y_{i,2}, \ldots, y_{i,10})$ for i=1, 2, 3, 4, to obtain the encoded bit pattern E, reference by 510. The entries $(x_{i,1}, x_{i,2}, \ldots, x_{i,10})$ of ith row are transformed such that the entry $y_{i,j}=y_{i,j-1}+x_{i,j}$ for j=1 to 10, where $y_{i,0}$ for each row is 0, and where the addition is modulo 2 addition. As shown, each row of the encoded bit pattern E thus has the run-lengths of 0's and the run-lengths of 1's of at least two and at most 8.

After generating the encoded bit pattern E, in an example implementation, the write controller 406 stores the encoded bit pattern E into the memristors in the memory array 100. The encoded bit pattern E is stored such that the states of the memristors in the memory array 100 map the 0's and 1's in the encoded bit pattern E. With this, the number of consecutive memristors in each row or in each column of the memory array 100 having a same state is at least the predefined lower limit d and at most the predefined upper limit f.

Further, in an example implementation, the read controller 408 reads the memristors in the memory array 100 row-wise or column-wise. When the encoded bit pattern E is such that the run-lengths of 0's and the run-lengths of 1's in each row therein is of at least the predefined lower limit d, and, accordingly, when the number of consecutive memristors in each row of the memory array 100 having the same state is also at least the predefined lower limit d, the read controller 408 reads the memory array 100 row-wise. Alternatively, when the encoded bit pattern E is such that the run-lengths of 0's and the run-lengths of 1's in each column therein is of at least the predefined lower limit d, and, accordingly, when the number of consecutive memristors in each column of the memory array 100 having the same state is also at least the predefined lower limit d, the read controller 408 reads the memory array 100 column-wise. By ensuring that at least d consecutive memristors in the each row or the each column of the memory array 100 have the same state, the width of the read pulse cycle for reading each memristor can be less than the RC time constant of the read circuit formed by the memristor. More particularly, the width of the read pulse cycle can be shortened by a factor of 1/w with respect to the read pulse cycle used otherwise. Here w is close to the run-length lower limit d. This results in increasing the speed of reading of the memory array 100 by a factor of w.

Figure 6:
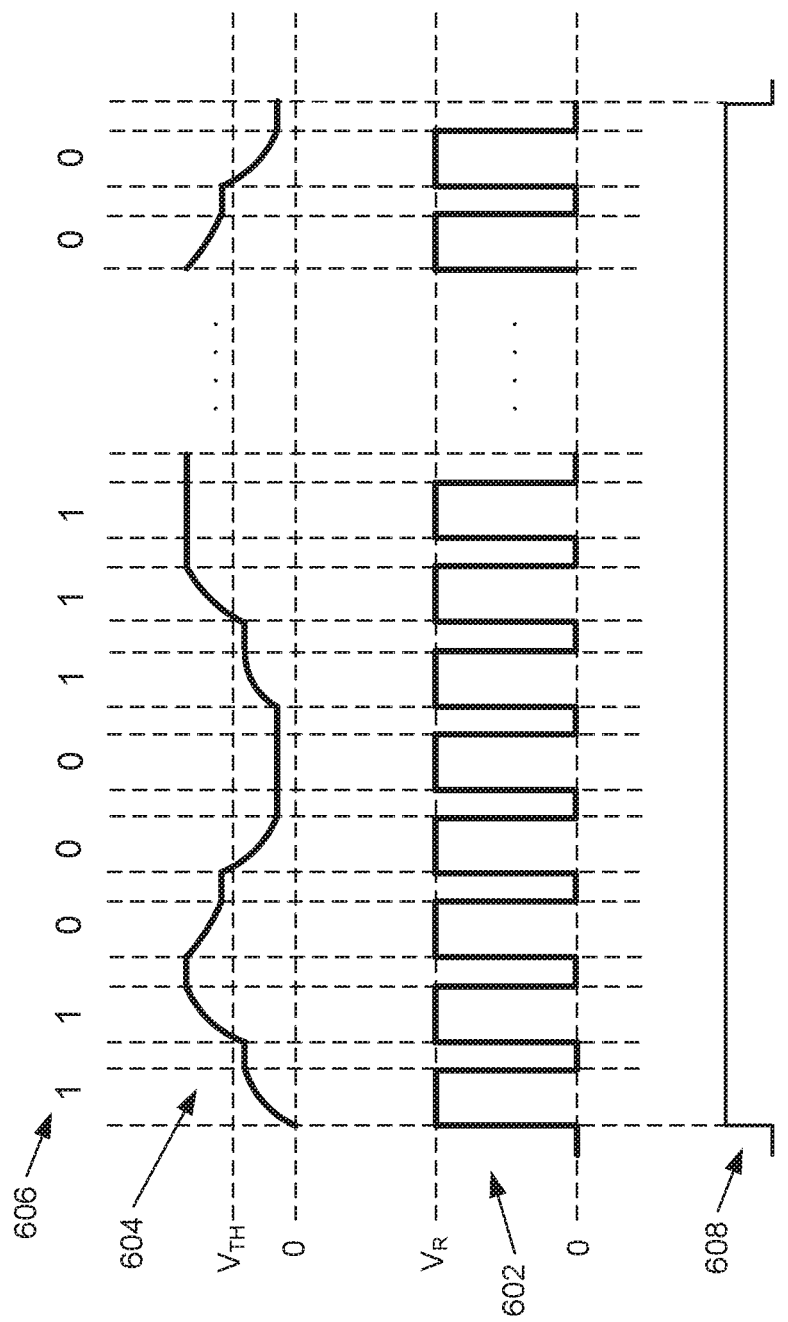
FIG. 6 illustrates a train of read pulses and a response signal for reading a sequence of memristors of a memory array, according to an example of the present subject matter.

FIG. 6 illustrates a train of read pulses 602 and a response signal 604 for reading memristors in the m×n memory array 100, according to an example of the present subject matter. The example illustrated through FIG. 6 is for the case where the memory array 100 stores the encode bit pattern E of m rows and n columns with the run-length lower limit d=2 in each row. That is, in each row of the memory array 100 at least two consecutive memristors are in the same state. The memristors in such a memory array 100 are read row-wise using m×n number of read pulses from the read controller 408, as depicted in the train of pulses 602. A data sequence 606 to be read includes data of row 1 followed by data of row 2, and so on, till the m$^{th}$ row. As shown in the response signal 604, with d=2, at least two consecutive read pulses drive the response signal upwards for consecutive 1's in the data sequence 606 and downwards for consecutive 0's in the data sequence 606. The amount of time for which the response signal 604 is driven upwards and downwards is correlated to the number of consecutive devices having the same state of 1 and 0, respectively. With d=2, the width of the read pulse cycle may be shortened by a factor of ½. Thus, the time for reading the memory array 100, as depicted by the width 608, is reduced and the speed of reading the memory array 100 is increased by a factor of 2.

It may be understood that the reading of the memory array 100 retrieves the encoded bit pattern E from the memory array 100. The decoder 410 decodes the retrieved encoded bit pattern E to obtain the input data. In an example implementation, the decoder 410 is programmed to decode the encoded bit pattern E by reversing the step followed by the encoder 404 for generating the encoded bit pattern E.

Further, with the encoding of the present subject matter, the number of entries in the encoded bit pattern E is more than the number of bits in the inputs data. Since all the entries of the encoded bit pattern E are stored in the memory array 100, the number of memristors in the memory array 100 has to be more than the number of bits in the input data. The difference between the number of entries in the encoded bit pattern E and the number of bits in the input data is referred to as redundancy. Let the redundancy be denoted by R. For the example illustrated through FIG. 5, the input data has 24 bits, and the encoded bit pattern E has 4×10=40 entries. Thus, the redundancy R is 16.

The read bandwidth efficiency for reading the memory array 100 in accordance with the present subject matter depends on the number of bits in the input data, the redundancy for storing the encoded bit pattern in the memory array 100, and the factor by which the speed of reading is increased. Let the read bandwidth efficiency be denoted by Q. The read bandwidth efficiency Q is defined as $[\{D/(D+R)\} \times w]$, where D is the number of bits in the input data, R is the redundancy, and w is the factor by which the speed of reading is increased, as described above. Thus, for a value of w if the redundancy R is such that Q>1, then the read bandwidth for the memory array 100 is improved. For the example illustrated through FIG. 5, D is 24, R is 16, and w is 2, which may be enabled by the run-length lower limit d=2. Thus, the value of Q is 1.2, which indicates the gain in read bandwidth efficiency.

Figure 7:
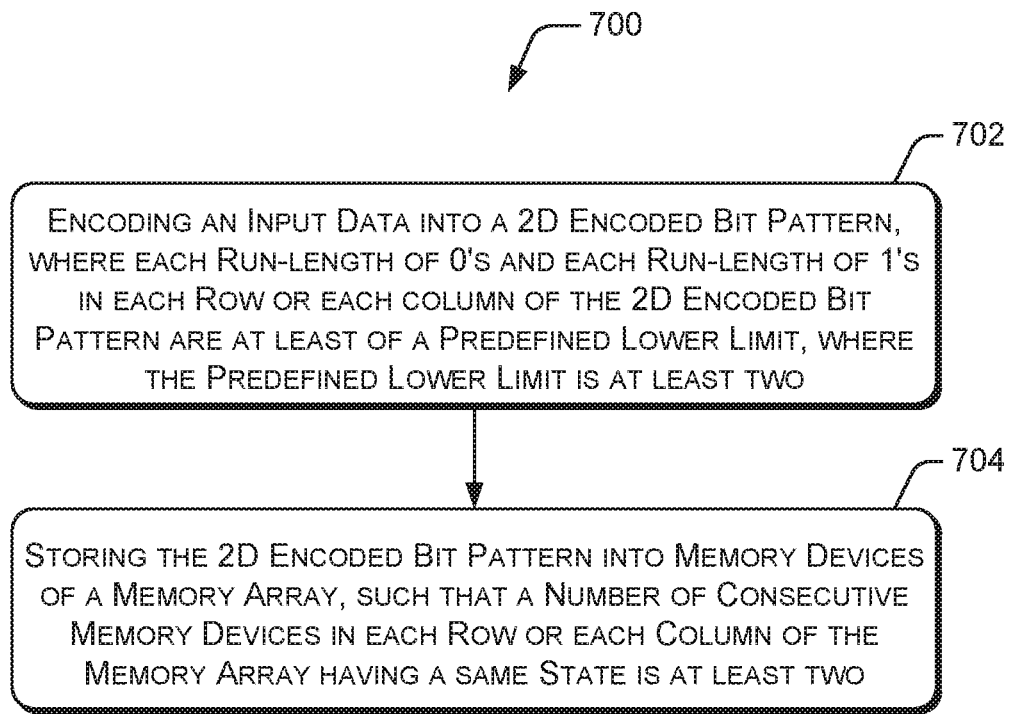
FIG. 7 illustrates a method of storing data into a memory array, according to an example of the present subject matter.

FIG. 7 illustrates a method 700 of storing data into a memory array, according to an example of the present subject matter. The order in which the method 700 is described is not intended to be construed as a limitation, and any number of the described method blocks can be combined in any order to implement the method 700, or an alternative method. It may be understood that steps of the method 700 can be performed by programmed memory controllers.

Further, although the method 700 of storing data into a memory array may be implemented in a variety of data storage systems; in an example implementation described in FIG. 7, the method 700 is explained in context of the aforementioned data storage system 400 having the memory array 100 having memory device, such as memristors, in m rows and n columns.

Referring to FIG. 7, at block 702, an input data is encoded into a 2D encoded bit pattern such that each run-length of 0's and each run-length of 1's in each row or in each column of the encoded bit pattern are at least of a predefined lower limit, where the predefined lower limit is at least two. Also, the input data may be encoded such that each run-length of 0's and each run-length of 1's in each row or in each column of the encoded bit pattern are at most of a predefined upper limit, for example, equal to 8. The input data may be encoded by the encoder 404 of the data storage system 400 as described earlier in the description.

At block 704, the encoded bit pattern is stored in the memory devices of the memory array 100, such that a number of consecutive memory devices in each row or each column of the memory array 100 having a same state is at least two. That is, depending on the encoded bit pattern, at least two consecutive memory devices either in each row or in each column of the memory array 100 are in the same state.

Further, the memory devices in the memory array 100 are read either row-wise or column-wise depending on the encoding and the storing of data into the memory array 100. Each memory device is read over one read pulse cycle, where the read pulse cycle has a width less than the RC time constant of the read circuit formed by the memory device being read.

Although implementations for storing data into a memory array have been described in language specific to structural features and/or methods, it is to be understood that the present subject matter is not necessarily limited to the specific features or methods described. Rather, the specific features and methods are disclosed and explained as example implementations for storing data into a memory array of a data storage system.

We claim:

1. A data storage system for storing data, comprising:
a memory array having memory devices in a crossbar configuration; and
a memory controller for controlling data storage in the memory array, the memory controller comprising:
an encoder to generate a 2-dimensional (2D) encoded bit pattern that encodes an input data, wherein each run-length of 0's and each run-length of 1's in each row or each column of the 2D encoded bit pattern are at least of a predefined lower limit, wherein the predefined lower limit is at least two; and
a write controller to write the 2D encoded bit pattern into the memory devices of the memory array, such that a number of consecutive memory devices in each row or each column of the memory array having a same state is based on the 2D encoded bit pattern.

2. The data storage system of claim 1, wherein each run-length of 0's and each run-length of 1's in each row or each column are at most of a predefined upper limit.

3. The data storage system of claim 1, wherein the memory controller comprises a read controller to read the memory devices row-wise, in response to the run-length of 0's and the run-length of 1's in each row of the 2D encoded bit pattern being at least of the predefined lower limit.

4. The data storage system of claim 3, wherein the read controller reads one memory device over one read pulse cycle of a read pulse from the read controller, wherein the read pulse cycle has a width less than a resistor-capacitor (RC) time constant of a read circuit formed by the one memory device.

5. The data storage system of claim 1, wherein the memory controller comprises a read controller to read the memory devices column-wise, in response to the run-length of 0's and the run-length of 1's in each column of the 2D encoded bit pattern being at least of the predefined lower limit.

6. The data storage system of claim 5, wherein the read controller reads one memory device over one read pulse cycle of a read pulse from the read controller, wherein the read pulse cycle has a width less than a resistor-capacitor (RC) time constant of a read circuit formed by the one memory device.

7. The data storage system of claim 1, wherein the memory devices are resistive switching devices, wherein a resistive switching device in a high resistive state is indicative of 0 storage and a resistive switching device in a low resistive state is indicative of 1 storage.

8. A method of storing data into a memory array having memory devices in a crossbar configuration, the method comprising:
   encoding, by a memory controller, an input data into a 2-dimensional (2D) encoded bit pattern, wherein each run-length of 0's and each run-length of 1's in each row or each column of the 2D encoded bit pattern are at least of a predefined lower limit, wherein the predefined lower limit is at least two; and
   storing the 2D encoded bit pattern into the memory devices of the memory array, such that a number of consecutive memory devices in each row or each column of the memory array having a same state is at least two.

9. The method of claim 8, wherein each run-length of 0's and each run-length of 1's in each row or each column are at most of a predefined upper limit.

10. The method of claim 8 further comprising:
   reading the memory devices row-wise, in response to the run-length of 0's and the run-length of 1's in each row of the 2D encoded bit pattern being at least of the predefined lower limit, to retrieve the 2D encoded bit pattern from the memory array.

11. The method of claim 10, wherein the reading of one memory device is over one read pulse cycle of a read pulse from the memory controller, wherein the read pulse cycle has a width less than a resistor-capacitor (RC) time constant of a read circuit formed by the one memory device.

12. The method of claim 8 further comprising:
   reading the memory devices column-wise, in response to the run-length of 0's and the run-length of 1's in each column of the 2D encoded bit pattern being at least of the predefined lower limit, to retrieve the 2D encoded bit pattern from the memory array.

13. The method of claim 12, wherein the reading of one memory device is over one read pulse cycle of a read pulse from the memory controller, wherein the read pulse cycle has a width less than a resistor-capacitor (RC) time constant of a read circuit formed by the one memory device.

14. The method of claim 8, wherein the encoding of the input data into the 2D encoded bit pattern comprises:
   generating from the input data a binary array with m rows and n columns, wherein each row of the binary array has at least a predefined number of 0's between two consecutive 1's, wherein the predefined number is based on the predefined lower limit; and
   transforming entries $(x_{i,1}, x_{i,2}, \ldots, x_{i,n})$ of each row of the binary array into entries $(y_{i,1}, y_{i,2}, \ldots, y_{i,n})$ of a respective row to obtain the 2D encoded bit pattern, wherein an entry $y_{i,j}$ is a sum of an entry $y_{i,j-1}$ and an entry $x_{i,j}$ for j=1 to n, wherein for j=1 the entry $y_{i,0}=0$, and wherein the sum is a modulo 2 addition.

15. The method of claim 8, wherein the encoding of the input data into the 2D encoded bit pattern comprises:
   generating from the input data a binary array with m rows and n columns, wherein each column of the binary array has at least a predefined number of 0's between two consecutive 1's, wherein the predefined number is based on the predefined lower limit; and
   transforming entries $(x_{1,j}, x_{2,j}, \ldots, x_{m,j})$ of each column of the binary array into entries $(y_{1,j}, y_{2,j}, \ldots, y_{m,j})$ of a respective column to obtain the 2D encoded bit pattern, wherein an entry $y_{i,j}$ is a sum of an entry $y_{i-1,j}$ and an entry $x_{i,j}$ for i=1 to m, wherein for i=1 the entry $y_{0,j}=0$, and wherein the sum is a modulo 2 addition.

16. The data storage system of claim 1, wherein the memory controller comprises a read controller to read one memory device of the memory array over one read pulse cycle of a read pulse from the read controller, wherein the read pulse cycle has a width less than a resistor-capacitor (RC) time constant of a read circuit formed by the one memory device.

17. The data storage system of claim 16, wherein the read controller is to read the memory devices row-wise or column-wise, depending upon the run-length of 0's and the run-length of 1's being at least of the predefined lower limit in each row or column of the 2D encoded bit pattern.

18. The data storage system of claim 1, wherein the memory devices comprise memristors.

19. The data storage system of claim 1, wherein the encoding of the input data into the 2D encoded bit pattern by the encoder comprises:
   generating from the input data a binary array with m rows and n columns, wherein each row or column of the binary array has at least a predefined number of 0's between two consecutive 1's, wherein the predefined number is based on the predefined lower limit; and
   transforming entries $(x_{i,1}, X_{i,2}, \ldots, X_{i,n})$ of each row or column of the binary array into entries $(y_{i,1}, y_{i,2}, \ldots, y_{i,n})$ of a respective row or column to obtain the 2D encoded bit pattern, wherein an entry $y_{i,j}$ is a sum of an entry $y_{i,j-1}$ and an $x_{i,j}$ for j=1 to n, wherein for j=1 the entry $y_{i,0}=0$, and wherein the sum is a modulo 2 addition.

20. The method of claim 8, wherein the memory controller reads one memory device of the memory array over one read pulse cycle of a read pulse from the controller, wherein the read pulse cycle has a width less than a resistor-capacitor (RC) time constant of a read circuit formed by the one memory device.

21. The method of claim 20, wherein the memory controller reads the memory devices row-wise or column-wise, depending upon the run-length of 0's and the run-length of 1's being at least of the predefined lower limit in each row or column of the 2D encoded bit pattern.

* * * * *